United States Patent [19]
Hirota

[11] Patent Number: 5,426,317
[45] Date of Patent: Jun. 20, 1995

[54] FRAME INTERLINE TRANSFER CCD IMAGER

[75] Inventor: Isao Hirota, Kanagawa, Japan

[73] Assignee: Sony Corporation, Tokyo, Japan

[21] Appl. No.: 185,231

[22] Filed: Jan. 21, 1994

Related U.S. Application Data

[63] Continuation of Ser. No. 981,895, Nov. 23, 1992, abandoned, which is a continuation of Ser. No. 526,975, May 22, 1990, abandoned.

[30] Foreign Application Priority Data

May 25, 1989 [JP] Japan .................................. 1-132168

[51] Int. Cl.⁶ .................... H01L 29/78; H01L 27/14; H01L 31/00
[52] U.S. Cl. ................................. 257/230; 257/223; 257/232; 257/233; 257/236; 348/250; 348/299; 348/303; 348/304; 348/314; 348/319
[58] Field of Search ............. 357/24 LR, 30 D, 30 H, 357/24, 24 M; 358/213.19, 213.29, 213.31; 257/230, 232, 233, 236, 223; 348/241, 250, 299, 303, 304, 314, 319

[56] References Cited

U.S. PATENT DOCUMENTS

| | | | |
|---|---|---|---|
| 4,447,735 | 5/1984 | Horii | 250/578 |
| 4,498,013 | 2/1985 | Kuroda et al. | 250/578 |
| 4,597,013 | 6/1986 | Matsumoto | 357/24 LR |
| 4,672,455 | 6/1987 | Miyatake | 357/24 LR |
| 4,717,945 | 1/1988 | Yush et al. | 357/24 LR |
| 4,748,486 | 5/1988 | Miyatake | 357/24 LR |
| 4,794,279 | 12/1988 | Yamamura et al. | 357/24 LR |
| 4,875,100 | 10/1989 | Yonemoto et al. | 358/213.19 |
| 4,947,224 | 8/1990 | Kuroda et al. | 357/24 LR |

FOREIGN PATENT DOCUMENTS 2537812   6/1984   France .
WO88/00759   1/1988   WIPO .

*Primary Examiner*—Ngan V. Ngo
*Attorney, Agent, or Firm*—Limbach & Limbach; Philip M. Shaw, Jr.

[57] ABSTRACT

A frame interline transfer CCD imager is so adapted that signal charges from the photosensor are read into a vertical transfer unit and are transferred at a high transfer rate from the vertical transfer unit to a storage section. The charges from each photosensor are drained during the high transfer rate transfer so that the photosensors are unable to store the signal charges to prevent the occurrence of blooming.

3 Claims, 3 Drawing Sheets

FRAME INTERLINE TRANSFER CCD IMAGER

This is a continuation of application Ser. No. 07/981,895 filed on Nov. 23, 1992, now abandoned which is a continuation of prior application 07/526,975, filed on May 22, 1990 now abandoned.

BACKGROUND OF THE INVENTION

1. Field of the Invention

This invention relates to a frame interline transfer (FIT) type CCD imager in which signal charges are transferred from a plurality of photosensors to vertical transfer units so as to be transferred via a storage section to a horizontal transfer unit,

2. Description of the Prior Art

The FIT type CCD imager is a solid state imager mainly comprised of an imaging section which is composed of photosensors arrayed in a matrix configuration, having vertical columns and horizontal rows, and vertical transfer units, a storage unit for transiently storing electrical charges, and a horizontal transfer unit for transferring the electrical charges on the line-by-line basis. Such technology is disclosed in, for example, the Japanese Patent Laid Open Publication No. 56-8966(1981).

With such a FIT type CCD imager, after the signal charges in the photosensors are read out into the vertical transfer units, during a vertical blanking period, the signal charges are transferred at a high transfer rate corresponding to the number of register stages in the storage section. The signal charges thus transferred by such transfer at the high transfer rate to the storage section are output by the horizontal transfer unit at an output buffer on a line-by-line basis.

However, when excess carriers are generated at the photosensors during signal charge transfer from the vertical transfer units to the storage section at the high transfer rate, the charges are caused to overflow from the photosensors into the vertical transfer units to produce so-called blooming. As a result, white tinted vertical streaks are produced on the monitor screen surface.

SUMMARY OF THE INVENTION

It is therefore a principal object of the present invention to provide a CCD imager in which blooming may be suppressed during the high transfer rate transfer period to output satisfactory video signals.

According to the present invention, there is provided a CCD imager comprised of a plurality of photosensors arrayed in a matrix form of vertical columns and horizontal rows vertical transfer units arrayed along vertical columns of the said photosensors, a storage section electrically connected to the vertical transfer units for transiently storing signal charges therein, and a horizontal transfer unit for transferring the signal charges transiently stored in the storage section in the horizontal direction on a line-by-line basis. The signal charges read out from each photosensor are transferred at a high transfer rate from the vertical transfer units to the storage section. During the high rate transfer of the signal charges, each photosensor is adapted so as not to store the signal charges therein. As a result, there is no lowering in sensitivity, while electrical charges may be prevented from leaking from the photosensors into the vertical transfer units. To cause signal charges not to be stored in the photosensors may be accomplished by draining the electrical charges into the substrate or into the drain, or by electronic shuttering.

DETAILED DESCRIPTION OF THE PREFERRED EMBODIMENT

The present embodiment shows an example of an FIT type CCD imager in which the substrate voltage is raised to a high level during transfer at a high transfer rate to prevent the blooming from occurring.

Figure 1:
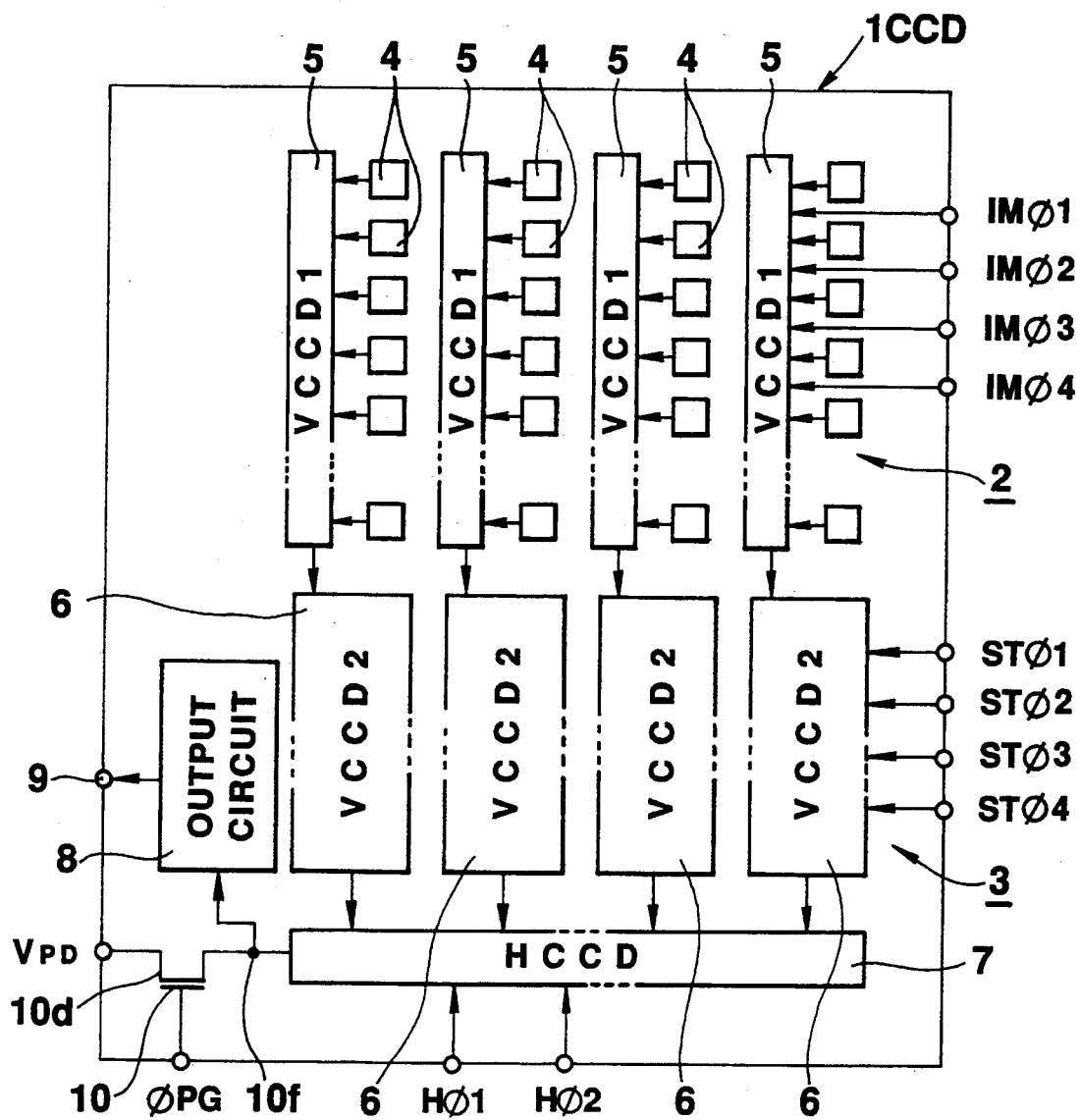
FIG. 1 is a diagrammatic view showing an overall arrangement of a typical CCD imager of the present invention.

FIG. 1 shows the general arrangement of the FIT type CCD imager which is comprised of a plurality of photosensors 4 arranged in a matrix form of vertical columns and horizontal rows, and first vertical registers 5 functioning as the vertical transfer units and constituting an imaging section 2 along with the photosensors 4. The photosensors 4 are of the vertical overflow drain construction types for draining unnecessary charges into the substrate, as will be described later. The first vertical registers 5 are formed along the respective vertical columns of the photosensors 4. A transfer gate 14 (FIG. 4) is provided between each photosensor 4 and the associated first vertical register 5 for reading out the signal charges. Transfer signals $IM\phi 1$ to signal $IM\phi 4$ are supplied to the first vertical registers 5 so that the electrical charges in the first vertical registers 5 are transferred at a high transfer rate to a storage section 3 by these 4-phase transfer signals $IM\phi 1$ to $IM\phi 4$.

With the CCD imager of the present illustrative embodiment, the storage unit 3 is provided in contiguity to these first vertical registers 5. The storage section 3 is comprised of separate second vertical registers 6, each of which is provided in association with a different one of the first vertical registers 5 associated with the respective vertical columns. The signal charges from the first vertical registers 5 are transferred at a high transfer rate to these second vertical registers 6 so as to be stored transiently therein. To these second vertical registers 6 are supplied 4-phase transfer signals $ST\phi 1$ to $ST\phi 4$ and it is 4-phase transfer signals $ST\phi 1$ to $ST\phi 4$ that the charges in the second vertical registers 6 are transferred further.

A horizontal register section 7 is provided on the opposite sides of the second vertical registers 6 with respect to the first vertical registers 5. The horizontal register 7 reads out the charge stored in each second vertical register 6 of the storage section 3 on a line-by-line basis. To this horizontal register section 7, the electrical charges corresponding to each horizontal row of photosensors 4 are transferred from the totality of the second vertical registers 6 so as to be sequentially output at an output circuit 8. To this horizontal register section 7, 2-phase transfer signals $H\phi 1$, $H\phi 2$ are supplied, so that the electrical charge transfer is performed by these transfer signals $H\phi 1$, $H\phi 2$.

From this horizontal register section 7, signals are taken out to the output circuit 8 via a floating diffusion 10f provided at the terminal end of the horizontal register section 7. The output circuit 8 may have, for example, a source follower configuration. Resetting is performed by a reset transistor 10. The gate of the reset transistor 10 is provided between the floating diffusion 10f and a reset drain 10d being supplied with precharging voltage $V_{PD}$. The on/off control operation of the reset transistor 10 is carried out by a precharging gate control voltage $\phi PG$ supplied to the gate of the reset transistor 10. A video signal $V_{OUT}$ of the CCD1 is output at an output terminal 9 of the output circuit 8.

Figure 4:
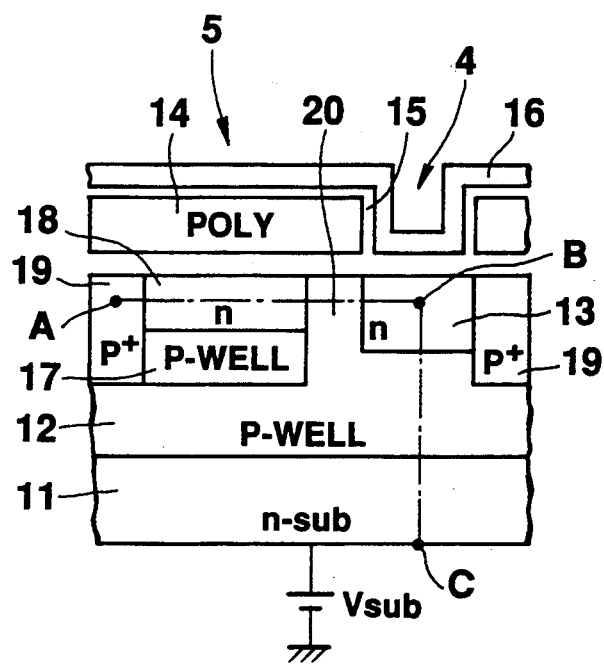
FIG. 4 is a fragmentary cross-sectional view showing an essential structure of the CCD imager shown in FIG. 1.

FIG. 4 shows the cross-section of the photosensors 4 and the first vertical registers 5. The CCD1 includes an n-type silicon substrate 11 provided with a p-type well region 12 in which the photosensors 4 and the first vertical registers 5 are formed.

The photosensor 4 is constituted by a photodiode which is formed by an n-type impurity region 13 in the p-type well region 12 and into which the radiation light is incident via an opening 15 defined between polysilicon layers 14 formed on the substrate surface. A sensor gate 16 is also formed on the substrate surface. The CCD imager 1 has a vertical overflow drain structure as the structure for draining unnecessary electrical charges. More specifically, the n-type silicon substrate 11 represents an overflow drain and the p-type well region 12 an overflow barrier. Thus an electronic shuttering operation is achieved by raising the substrate voltage $V_{sub}$ applied to the n-type silicon substrate 11. Above all, it becomes possible to suppress the blooming by performing the electronic shuttering operation during the high transfer rate transfer operation, as will be described subsequently.

The first register 5 is able to transfer electrical charges by a buried channel region 18 on the top of a second p-type well region 17, designed for preventing smearing, with the polysilicon layer 14 as the transfer electrode 14. The buried channel region 18 faces the substrate surface and is separated from the remaining vertical columns by channel stop regions 19. It is a region 20 which is disposed below the polysilicon layer 14 and which is spaced apart from the n-type impurity region 13 that acts as a readout gate.

The electronic shuttering operation by the vertical overflow drain structure is hereinafter-explained by referring to FIGS. 2 and 3.

Figure 2:
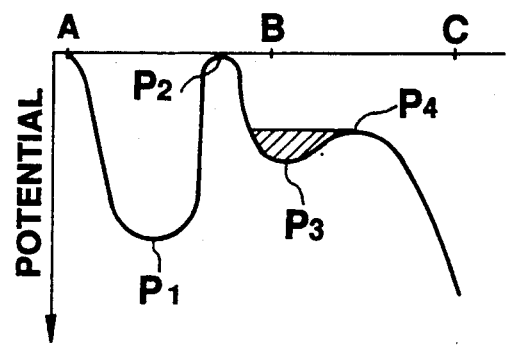
FIG. 2 is a chart showing a potential distribution along a line A-B-C in FIG. 4 in the charge storage state of the CCD imager shown in FIG. 1.
Figure 3:
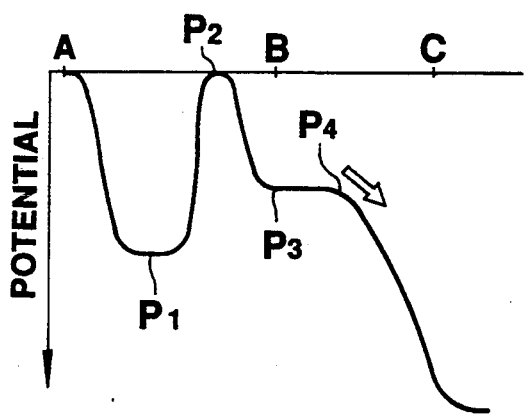
FIG. 3 is a chart showing a potential distribution along a line A-B-C in FIG. 4 in the charge draining state of the CCD imager shown in FIG. 1.

FIGS. 2 and 3 are charts showing the potential energies along a line A-B-C in FIG. 4, wherein FIG. 2 shows the state of electron storage and FIG. 3 the state of electron draining.

In the charge storage state, shown in FIG. 2, a point $P_3$ by the n-type impurity region 13 represents a potential well. A potential barrier is formed at each of a point $P_4$, by the p-type well region 12, and a point $P_2$, by the readout gate, and electrical charges are stored at the side of the point $P_3$ of the n-type impurity region 13. Reading is performed with the point $P_2$ at the readout gate being lowered by the high potential $V_H$ and with the electrical charges thus flowing from the point $P_3$ of the n-type impurity region 13 towards a point $P_1$ of the buried channel region 18. Meanwhile, charge transfer is effected by the potentials at the points $P_2$ and $P_1$ being changed at the required driving periods by the polysilicon layer 14 to which a low potential $V_L$ and an intermediate potential $V_M$ are supplied.

FIG. 3 shows the potential state during draining, that is, during electronic shuttering. With the application of the high substrate voltage $V_{sub}$, the potential at the point $P_4$ by the well region 12 as the potential barrier is lowered, such that the electrical charges stored at the side of the point $P_3$ are drained into the n-type semiconductor substrate 11. Under this condition, the photosensor 4 is not in the storage state. The CCD1 of the present illustrative embodiment is able to perform the electronic shuttering in the above described manner.

Figure 5:
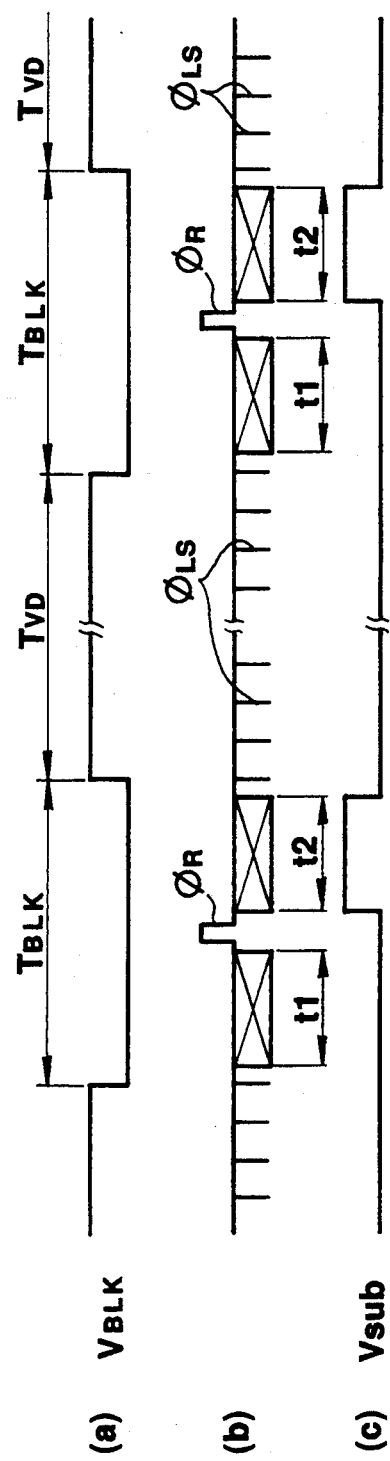
FIG. 5 is a timing chart for illustrating the operation of the CCD imager of the present invention.

The operation of the CCD1 of the present illustrative embodiment is hereinafter explained by referring to FIG. 5, wherein the signal (a) shows a vertical blanking period $T_{BLK}$ and an image period $T_{VD}$, the signal (b) a vertical drive pulse of the CCD and the signal (c) a substrate voltage $V_{sub}$.

During the signal or video period $T_{VD}$, signal charges are transferred by a line shift pulse $\phi LS$ from the second vertical registers 6 to the horizontal register section 7 on a line-by-line basis. The video signal $V_{OUT}$ is output from the horizontal register section 7 via output circuit 8.

Then, during the vertical blanking period $T_{BLK}$, unnecessary electrical charges are first drained during the period $t_1$. This draining operation, which is performed for draining the unnecessary charges from the vertical registers 5, 6, is performed by transferring these unnecessary electrical charges in the same direction as the signal charge transfer direction or in the opposite direction thereto for draining these charges into predetermined charge absorbing sections or regions.

After the above described draining and transfer of the unnecessary electrical charges, readout pulses $\phi R$ are applied to read out the signal charges in the photosensor 4 into the first vertical register 5.

After the readout operation, and within a period $t_2$ of the same vertical blanking period $T_{BLK}$, a high transfer rate transfer of the signal charges read from the first vertical registers 5 into the second vertical registers 6 is performed. When the substrate voltage $V_{sub}$ is raised to a higher voltage during this period $t_2$, the state of the photosensor 4 is changed from the potential state of storing the electrical charges as shown in FIG. 2 to the potential state of draining the electrical charges into the substrate as shown in FIG. 3. Thus the electrical charges are not stored in the photosensor 4 during the high transfer rate transfer period $t_2$ to prevent the occurrence of the blooming in which excess charges are allowed to overflow during transfer from the photosensor 4 into the vertical registers to produce white-tinted vertical streaks. After termination of the high transfer rate transfer period $t_2$, the substrate voltage $V_{sub}$ is reset to its original voltage, so that the photosensor 4 is again in the charge storage state. Although the sensitivity is lowered by an amount corresponding to the failure to store the charges during the high transfer rate transfer period $t_2$, such lowering in sensitivity is in the order only of several percent.

With the above described CCD imager of the present embodiment, the photosensors 4 are brought to a state of not storing electrical charges during the high transfer rate transfer within the vertical blanking period to prevent the occurrence of flaws, such as white-tinted vertical streaks, due to the above mentioned blooming.

It is noted that, although the vertical overflow drain is operated with the present CCD to prevent the charges from being stored in the photosensor, a transverse or horizontal overflow drain may also be operated during the high transfer rate transfer of the electrical charges. Or alternatively, the potential well of the photosensor may be increased in depth, and/or the barrier of the readout gate may also be increased in height to achieve the same effects.

What is claimed is:

1. A CCD imager for receiving a radiation image and converting the same into electrical charges comprising:

a semiconductor substrate of a first conductivity type;

a plurality of photosensors arranged in a matrix configuration of vertical columns and horizontal rows on the semiconductor substrate for photoelectrically converting the incident light into corresponding electrical signal charges;

a well region of a second conductivity type formed on the semiconductor substrate, the well region forming a potential barrier to draining of the signal charges at the photosensors into the substrate;

vertical transfer means arrayed along vertical columns on the semiconductor substrate for transferring the signal charges in the vertical direction;

storage means provided on the semiconductor substrate in contiguity to the vertical transfer means and electrically connected to the vertical transfer means, for transiently storing the signal charges;

horizontal transfer means provided on the semiconductor substrate in contiguity with the storage means and electrically connected to the storage means, for transferring the signal charges transiently stored in the storage means on a line-by-line basis;

drive means for firstly draining unnecessary charges from the vertical transfer means during a first period of the vertical blanking period, reading out the signal charges in the photosensors into the vertical transfer means during a second period of the vertical blanking period after draining unnecessary charges from the vertical transfer means, for transferring the read out signal charges in a high speed transfer into the storage means and for lowering a potential barrier of the well preventing the occurrence of blooming, in which excess charges are allowed to overflow from the photosensors into the vertical transfer means during a third period following to the second period in the vertical blanking period.

2. The CCD imager according to claim 1 wherein an overflow drain is provided at each photosensor for draining electrical charges at each photosensor into the overflow drain during the transfer at the high transfer rate.

3. The CCD imager according to claim 1 wherein an overflow drain is provided at each photosensor for draining electrical charges and during the vertical blanking period, when the line-by-line charge transfer in the horizontal direction is not performed, unnecessary charges in the vertical transfer means are discharged and signal charges are read from each photosensor into each vertical transfer means and, during the time when the high transfer rate transfer is performed after the signal charge reading from the vertical transfer means into the storage means, the charges in each photosensor are drained into the overflow drain.

* * * * *